United States Patent [19]
Pollachek

[11] Patent Number: 6,051,995
[45] Date of Patent: Apr. 18, 2000

[54] CONSTANT IMPEDANCE, LOW NOISE CMOS BUFFER

[75] Inventor: Robert Gary Pollachek, Vancouver, Wash.

[73] Assignees: Sharp Electronics Corporation, Mahwah, N.J.; Sharp Kabushiki Kaisha, Osaka, Japan

[21] Appl. No.: 09/151,942

[22] Filed: Sep. 11, 1998

[51] Int. Cl.[7] .............................................. H03K 19/0185
[52] U.S. Cl. .................................. 326/87; 326/83; 326/27
[58] Field of Search ................................. 326/22, 23, 83, 326/86, 87, 26, 27

[56] References Cited

U.S. PATENT DOCUMENTS

| | | | |
|---|---|---|---|
| 4,785,203 | 11/1988 | Nakamura | 326/87 |
| 4,789,796 | 12/1988 | Foss | 307/443 |
| 4,855,623 | 8/1989 | Flaherty | 326/87 |
| 4,880,997 | 11/1989 | Steele | 307/443 |
| 4,961,010 | 10/1990 | Davis | 307/443 |
| 5,081,374 | 1/1992 | Davis | 307/451 |
| 5,089,722 | 2/1992 | Amedeo | 326/87 |
| 5,120,999 | 6/1992 | Schreck et al. | 307/443 |
| 5,315,173 | 5/1994 | Lee et al. | 307/443 |
| 5,329,175 | 7/1994 | Peterson | 307/443 |
| 5,398,318 | 3/1995 | Hiraishi et al. | 395/250 |
| 5,438,278 | 8/1995 | Wong et al. | 326/27 |
| 5,656,960 | 8/1997 | Holzer | 327/170 |
| 5,914,618 | 6/1999 | Mattos | 326/87 |

*Primary Examiner*—Jon Santamauro
*Assistant Examiner*—Don Phu Le
*Attorney, Agent, or Firm*—David C. Ripma; Matthew Rabdau

[57] ABSTRACT

A low noise CMOS buffer has been provided which includes the advantages of having a stable load impedance and a linear-ramped current waveform at the output. The buffer adds waveform shaping transistors to delay the turn on of the driver circuits, and to shape the voltage and current waveforms of the drivers. These critically placed waveform shaping transistors accomplish the function of turning off the drivers in a manner to encourage an opposite polarity linear ramp current waveform at the buffer output. A method of using waveform shaping transistors to form a stable output impedance and a linear-ramped current waveform at the output of a buffer is also provided.

12 Claims, 11 Drawing Sheets

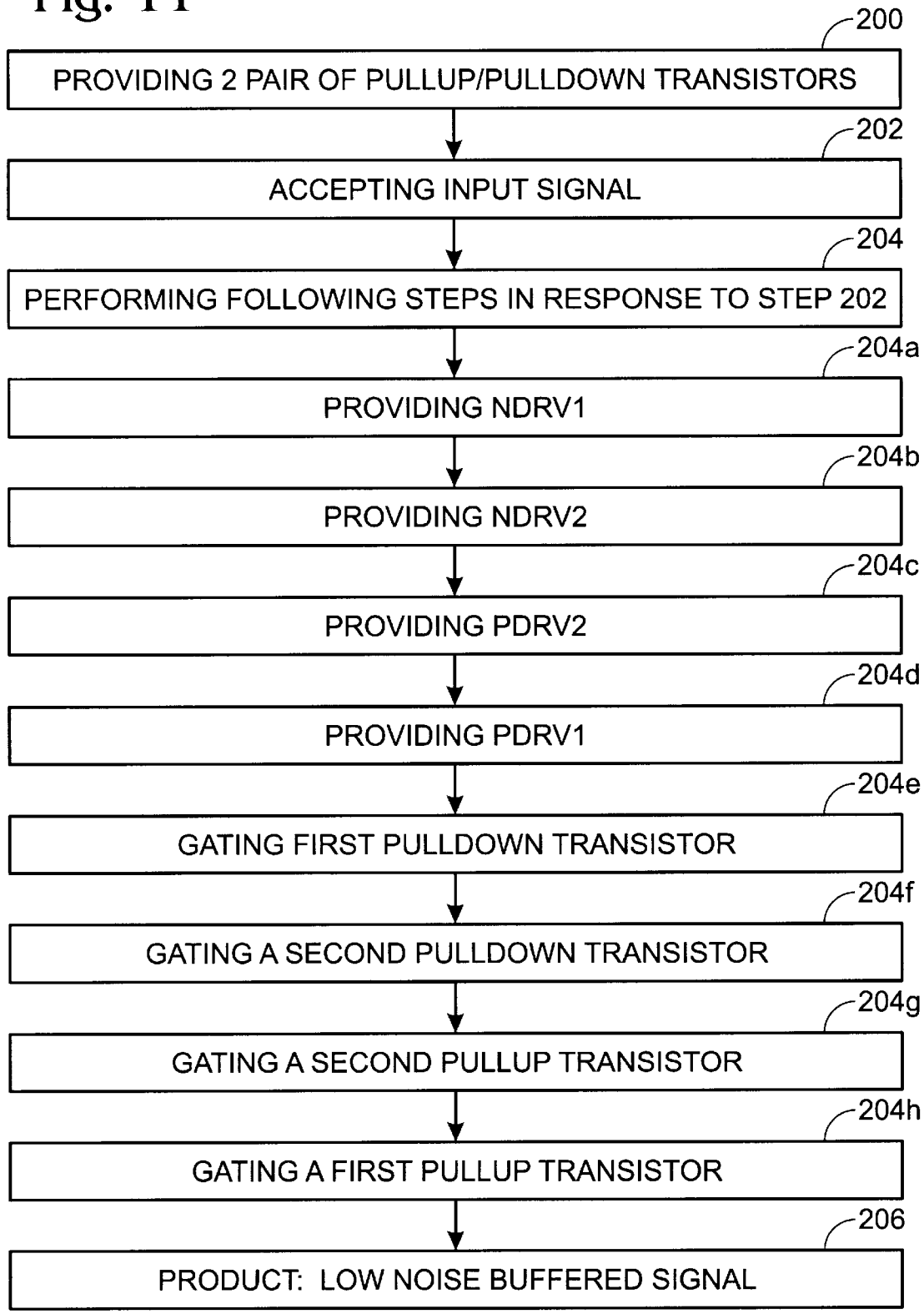

CONSTANT IMPEDANCE, LOW NOISE CMOS BUFFER

BACKGROUND AND SUMMARY OF THE INVENTION

This invention is related generally to integrated circuit (IC) design and fabrication and, more particularly to a CNIOS buffer having a stable output impedance with a controlled current waveform to reduce signal noise, and noise on the IC power and ground nodes.

Each generation of faster chips requires I/O buffer designs which provide better control over supply noise, and faster switching speed of ever-widening data busses. The data transfer rate of digital chips is limited by the achievable clock-to-data propagation delays, which are dominated by output slew rate and noise limitations determined by the output buffer design. Transferring data at gigabits per second rates requires a combination of wide data paths and high frequency signaling. Yet it remains desirable to communicate between digital devices using standard widely-accepted logic levels such as the LVTTL (low voltage transistor transistor logic) I/O interface specification. Chip data output drivers compatible with this standard must be capable of slewing high capacitance loads (many tens of picofarads) through relatively large voltage transitions (>2 volts) at ever increasing speeds. The resulting displacement currents must flow through I/O pin and power/ground pin inductances, causing self-induced voltage spikes which can interfere with device operation.

Contemporary chip packaging technology has not kept pace with the increasing frequency demands, typically interposing several nano-henries of package lead inductance between chips and their board-level power and ground planes. Inductive parasitics introduce noise components, such as "ground bounce", worsen in proportion to the square of switching speed. Since package parasitics have not improved sufficiently to keep up with switching speed requirements, the design of output buffers must be improved to more closely approach the best possible trade-off between switching speed and noise for any given package configuration.

For example, a data bus switching at 100 MHz must slew at a rate of over one volt per nanosecond. Each power and ground pin must typically drive up to eight data pins, each loaded by typically 35 pF of capacitance, through 2 volt excursions within 2 nanoseconds. A line ar-ramped (triangular) current/time waveform is the most efficient for transporting maximum charge from a load capacitance in minimal time without exceeding a preset noise voltage limit, since the noise arises from the rate of change of current according to the self-inductance equation v=Ldi/dt. The required voltage slew rate could be obtained by fashioning a triangular current pulse which ramps up linearly from 0 for the entire 2 ns slew time, reaching a peak value determined by:

$$Qcap = N*C*\Delta V = \int i(t)dt$$

where N=number of outputs simultaneously driving their capacitive loads C through a common power/ground current path. For a linear current ramp:

$$i(t)=Ipeak*(t-t_0) \rightarrow \int i(t)dt=Ipeak*\Delta t/2 \rightarrow Ipeak =2*N*C*\Delta V/\times t=2*8 \text{ drivers}*35pF*2v/2ns=0.56 \text{ amps}$$

This would result in an induced voltage doublet (noise spike) through typically 3 nanohenries of power/ground self-inductance determined by:

$$Vpeak=Ldi/dt=3nH*0.56A/2ns=\pm0.84 \text{ volts}.$$

In practice, the higher frequency components of the noise doublet will be filtered by the L-R-C network comprising the package power pin inductance, drivers' channel resistance, load capacitances and load pins' inductances, resulting in a damped sinusoidal ringing of the output transition edges. However, the resistances of the switching driver transistors are time-varying. Thus, the peak magnitude and duration of this ringing depends on the details of the output driver transistors' switching transitions between a state which provides a low-channel-impedance current path to the power pin, through a higher-impedance state, to a low-channel-impedance connection to the ground pin. Meanwhile, the load voltage swings (whose rate must be maximized while its overshoots must be limited) affect the time-varying resistive components of the network by changing the operating modes of the nonlinear switching transistors.

The problem is to provide a practical circuit which rapidly charges the load network while controlling and limiting the noise components to prevent system misbehavior. These noise components arise from three main sources, each of which typically places a maximum limit of about 0.4 volts (for LVTTL) on the effective supply noise:

A. multiple switching of inputs at the receiving chip in response to multiple bounces of the output voltage;

B. false-switching of any quiescent (non-switching) outputs which share common power/ground connections with switching outputs; and C. false-switching of chip inputs or internal logic due to noise coupled to internal power distribution networks through the chip's common substrate and power connections.

Numerous attempts have appeared in the literature to provide circuits which tailor the aforementioned impedance transitions in order to produce faster waveforms. Each has disadvantages however. Some require that the outputs remain non-driven (high-Z) for a period of time prior to going to a valid logic level. However, this sequence of events is intolerable for many digital systems, which strive to minimize the interval during which the outputs are indeterminate. Others reduce the voltage swing to less than the LVTTL requirements. Others draw DC current making them inappropriate for low-standby-power applications. Others require the impractical addition of external components such as resistors or reference voltages. More practical approaches use on-chip resistors to stabilize slew rate, but unfortunately use them in configurations which produce sub-optimal and imprecise shaping of current waveforms, making them incapable of attaining the speed/noise performance levels required by the 100 MHz operation given in the example above.

Another approach has been to subdivide the output buffer into multiple drivers which are activated at successive time intervals, thereby reducing the simultaneity of the resulting current components to give another means of controlling the speed/noise trade-off. However, without means to assure that these time-separated current pulses remain blended (through variation of supply voltage, temperature, and process) into a smoothly ramped homogeneous composite waveform, the result is current variations as each stage kicks in which again results in less than optimal speed/noise trade-off. As described in further detail below, what is needed is a means for these multiple stages to interact so as to smooth out and minimize ripples in the composite current waveform. Finally, the prior art does not address the issue of cross-coupled noise-sources, see C above. That is, the interaction between noisy power networks connected to output driver transistors, and quiet power networks connected to noise-sensitive parts of the chip such as input buffers, sense amplifiers, or timing generators needs to be addressed. Noise from the output driver transistors is coupled into the common chip substrate mainly through either ohmic or diode connections to the noisy power busses (substrate ties and drain to substrate junctions respectively), or directly from circuitry powered by those quiet power supplies, such as the output buffer pre-drivers. The common substrate resistively couples energy from the large voltage excursions experienced by noisy-power-pin inductances through the common substrate into nearby quiet power busses. I/O buffer pre-driver circuits inject current directly into the quiet power rails which supply those circuits. Together these can cause significant ripple through the package inductance of quiet power pins as well, resulting in misbehavior of noise-sensitive circuitry if not controlled by the buffer design.

The prior art in FIG. 1 shows a buffer which attempts to control the rates of turn-on and turn-off of output drivers by using resistors in series with both the source and drain terminals of the pre-drivers which control the output drivers' gates. Here, the cross-connection between pre-drivers forces faster turn-off than turn-on of the driver transistors. This minimizes crowbar current, but necessarily results in slower switching speed due to the delayed turn-on event. The resistors cause the pre-drivers to produce exponentially decaying voltage waveforms, which results in a time derivative (current slope and inductive noise) which is also exponentially decaying: the turn-on of the output driver begins with a performance-limiting noise peak which immediately begins to decay, contributing ever-less to the charging rate of the output load.

The prior art in FIG. 2 shows a buffer to which an output-enable signal has been added. It also uses resistors in the pre-drivers, resulting in disadvantageous exponential waveforms similar to those produced by the buffer in FIG. 1. Crowbar current avoidance has again been emphasized at the expense of speed, since driver turn-off must occur in this buffer before driver turn-on.

The prior art in FIG. 3 illustrates a modification for making the driver turn-on voltage ramp rate linear rather than exponential, by using a current mirror as a constant-current source to linearly charge the driver gate capacitance. One drawback to this technique is that the current mirrors introduce a DC current path between the power supplies, making it unattractive for applications requiring essentially zero standby current. Another drawback is that the linear voltage ramp applied to the gate of the driver MOSFET does not produce a linear ramp in its drain current: An ideal MOSFET is a square-law device. Its drain current increases in proportion to the square of its gate voltage when in saturation.

The prior art in FIG. 4 shows a buffer with an enable input which again uses resistors in the pre-drivers to control the turn-on rate to be slower than the turn-off rate, with the disadvantages mentioned above. Additional resistors have been added in series with the drains of the output driver transistors to stabilize the output impedance. This reduces impedance variation due to MOSFET manufacturing tolerances (e.g. channel length, threshold, gate oxide thickness). There are several disadvantages however: the added resistance delays the output when driving a capacitive load due to the additional RC time constant; and the voltage drop due to DC load current through the resistors impairs its ability to attain sufficient steady-state voltage levels required by interface standards such as TTL.

The prior art in FIG. 5 shows a composite buffer created essentially by connecting two output buffers in parallel to the same output pin. One of the two sets of drivers (the one with smaller drive current) is turned on or off quickly by a fast pre-driver. The larger parallel driver is turned on at a later time by a delayed pre-driver. This produces a somewhat slower buffer due to the delayed turn on of the larger driver stage, in exchange for somewhat less peak noise: it produces a succession of smaller noise spikes instead of the single larger spike produced by other prior-art buffers. Unfortunately, the time delay between the activation of successive stages (and successive noise spikes) is largely wasted, since it does not contribute to hastening the slew rate of the load.

A problem common to all of the above examples is this: the turn-off of their large, high-capacitance output driver gates must be accomplished very quickly, as this paces the overall switching speed of the composite buffer. This rapid turn-off requires that a rapid spike of discharge current be injected through the pre-driver into a power supply rail to discharge this gate capacitance. Often a limited availability of package pins dictates that the power supply rail and common substrate connections for the pre-drivers must be shared among many other output buffer pre-drivers and also among other internal circuitry of the integrated circuit, such as input buffers. It is usually preferable to connect pre-drivers and input buffers to the "quiet" internal supply rails, since their data and control input signals originate outside the buffer but are referenced to these same quiet supply levels. This assures predictable response of the buffer in the presence of supply noise. However, with common power connections the combined simultaneous switching current from a multitude of such buffer pre-drivers can induce sufficient noise to disturb the operation of other circuits which share these quiet power rails. Thus there remains an un-met need to reduce the initial activation current spike from the pre-drivers.

It would be advantageous if a CMOS buffer could be designed to control power supply noise during transitions of high-drive buffers by tailoring the switching waveforms to produce a speed/noise performance tradeoff very close to the package's theoretical best. It would also be advantageous if the buffer did not require external reference components, or DC current flow to generate reference currents. Further, it would be advantageous if there were no time-wasting active calibration intervals or slew-rate-switching delays.

It would be advantageous if a CMOS buffer could be designed to provide clean output transitions with more stationary output impedances, without entering a high-impedance state prior to any output transition. It would be advantageous if the CMOS output impedance more consistently matched the transmission line load impedance. It would also be advantageous if the buffer could maximize the data-valid interval to provide as much setup and hold time as possible in synchronous systems.

It would be advantageous if the output driver stages were coupled to produce a smooth continuous current waveform rather than the two (or more) distinct current and noise pulses seen in prior art.

It would be advantageous if the switching noise induced into quiet power busses could be reduced by decreasing the rates of change of current through transistors connected to those quiet power busses without sacrificing speed.

Accordingly, a low noise CMOS circuit to provide a constant impedance load and linear ramped current waveform at the circuit output in response to receiving an input signal at a circuit input is provided. The circuit comprises first (Vddp) and second (Vdd) power supply nodes, and first (Vssp) and second (Vss) ground nodes. A first pair of driver transistors are included, with the source of PMOS transistor P5 operatively connected to the first power supply node (Vddp), the drain of said P5 PMOS operatively connected to the output and the drain of NMOS transistor N5, and the source of said N5 NMOS operatively connected to the first ground node (Vssp).

A second pair of driver transistors are operatively connected in parallel to the first transistor pair, with the source of PMOS transistor P6 operatively connected to the first power supply node (Vddp), the drain of said P6 PMOS operatively connected to the output and the drain of NMOS transistor N6, and the source of said N6 NMOS operatively connected to the first ground node (Vssp).

Four pre-driver circuits are included, which each pre-driver circuit including a transistor pair, with the source of a PMOS transistor (P1, P2, P3, and P4) operatively connected to the second power supply node (Vdd), the drain of said PMOS transistors operatively connected to a pre-driver output and the drain of an NMOS transistor (N1, N2, N3, and N4), and the source of said NMOS transistors operatively connected to the second ground node (Vss).

A first pre-driver includes said P1 and N1 transistors, with the gates of said P1 and N1 transistors operatively connected to the circuit input to accept the input signal. The first pre-driver output is operatively connected to the gate of driver PMOS P5 to supply the pdrv1 signal A second pre-driver includes said P2 and N2 transistors, with the gates of said P2 and N2 transistors operatively connected to the circuit input to accept the input signal. The second pre-driver output is operatively connected to the gate of said driver PMOS P6 to supply the pdrv2 signal.

A third pre-driver includes said P3 and N3 transistors, with the gates of said P3 and N3 transistors operatively connected to the circuit input to accept the input signal. The third pre-driver output is operatively connected to the gate of said driver NMOS N6 to supply the ndrv2 signal.

A fourth pre-driver includes said P4 and N4 transistors, with the gates of said P4 and N4 transistors operatively connected to the circuit input to accept the input signal. The fourth pre-driver output is operatively connected to the gate of said driver NMOS N5 to supply the ndrv1 signal.

A first NIMOS (N7) pullup transistor is included, with the drain of N7 NMOS being operatively connected to the second power supply node (Vdd), the source being operatively connected to the gate of P6 PMOS, and the gate being operatively connected to the gate of N5 NMOS gate.

A second NMOS (N8) pullup transistor is included, with the drain of N8 NMOS being operatively connected to the second power supply node (Vdd), the source being operatively connected to the gate of P5 PMOS gate, and the gate being operatively connected to the gate of N5 s NMOS.

Finally, a first PMOS (P7) pulldown transistor is included, with the source of P7 PMOS being operatively connected to the gate of N6 NMOS, the drain being operatively connected to the second ground node (Vss), and the gate being operatively connected to the gate of N5 NMOS, whereby the circuit minimizes the generation of noise at the power nodes, ground nodes, and circuit output.

In some aspects of the invention, a first resistor having a first node is operatively connected to the source of third pre-driver P3 PMOS and the first N7 NMOS pullup transistor drain, and a second node is operatively connected to the second power supply node (Vdd). A second resistor having a first node is operatively connected to the source of the second pre-driver N2 NIMOS and the first P7 PMOS pulldown transistor drain, and a second node is operatively connected to the second ground node (Vss).

BRIEF DESCRIPTION OF THE DRAWINGS

FIG. 11 is a flowchart illustrating the present invention method for providing an output having a constant impedance load with a linear ramped current waveform.

DETAILED DESCRIPTION OF THE PREFERRED EMBODIMENT

Figure 1:
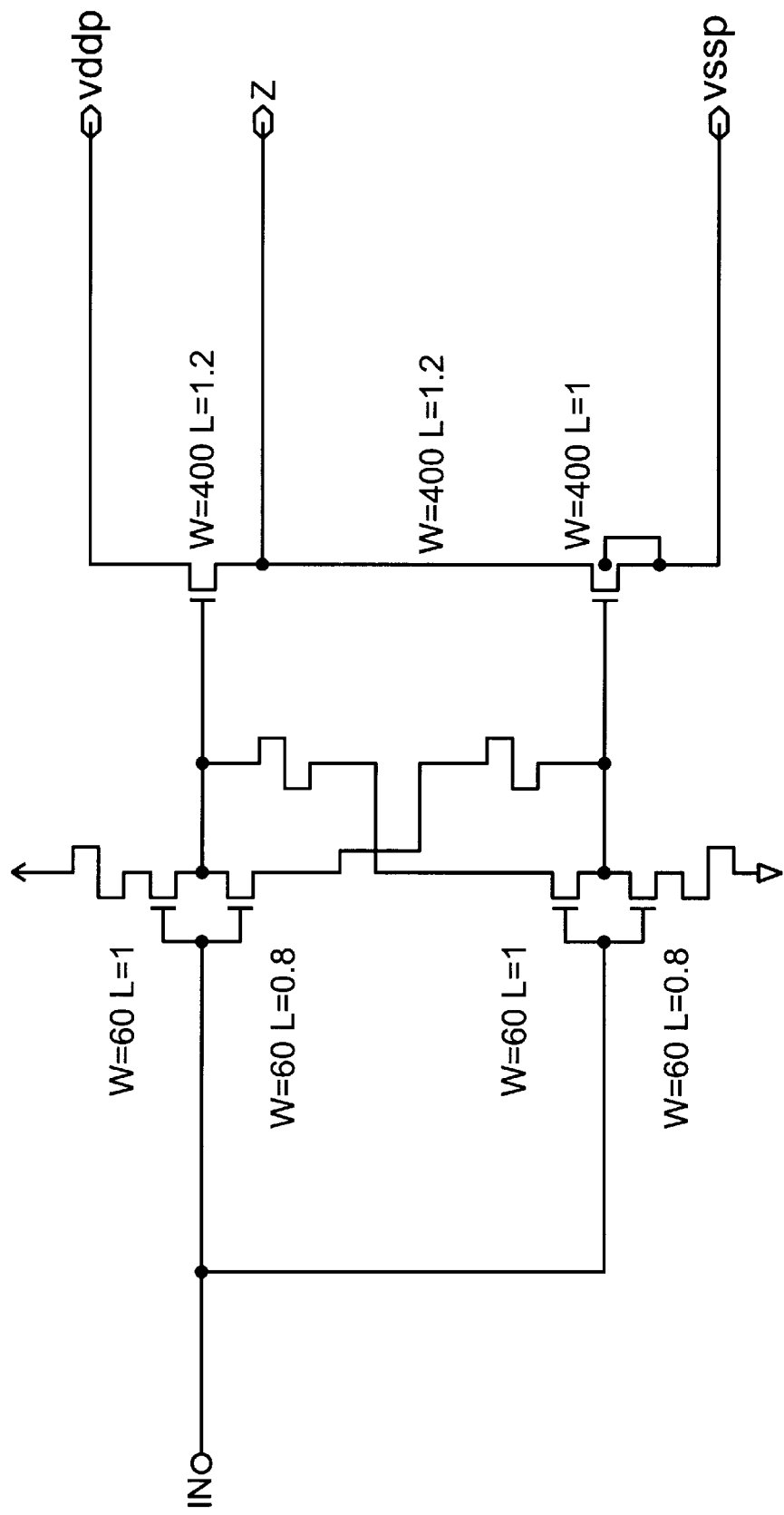
FIGS. 1–5 illustrate prior art buffer circuits.
Figure 2:
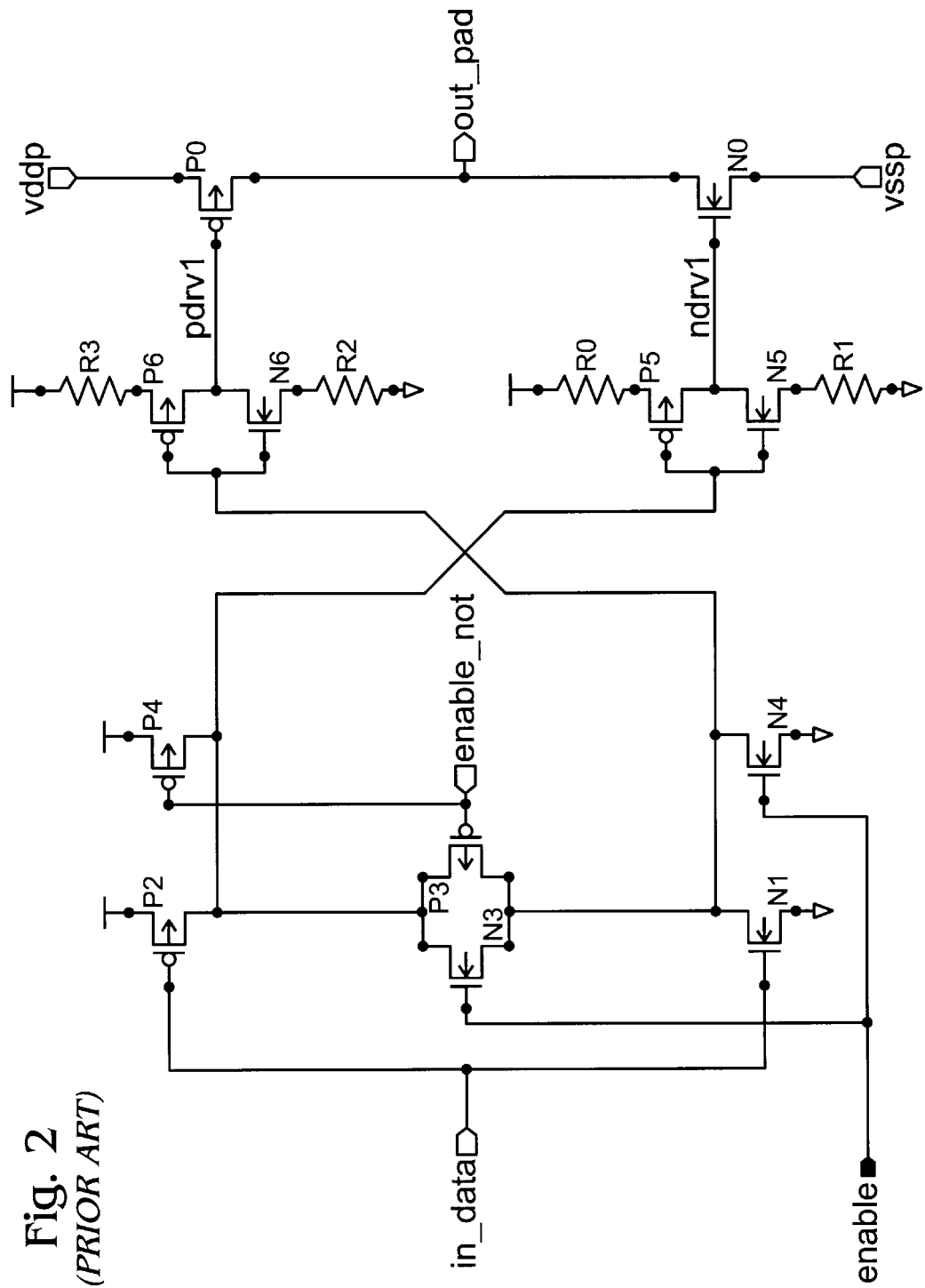
Figure 3:
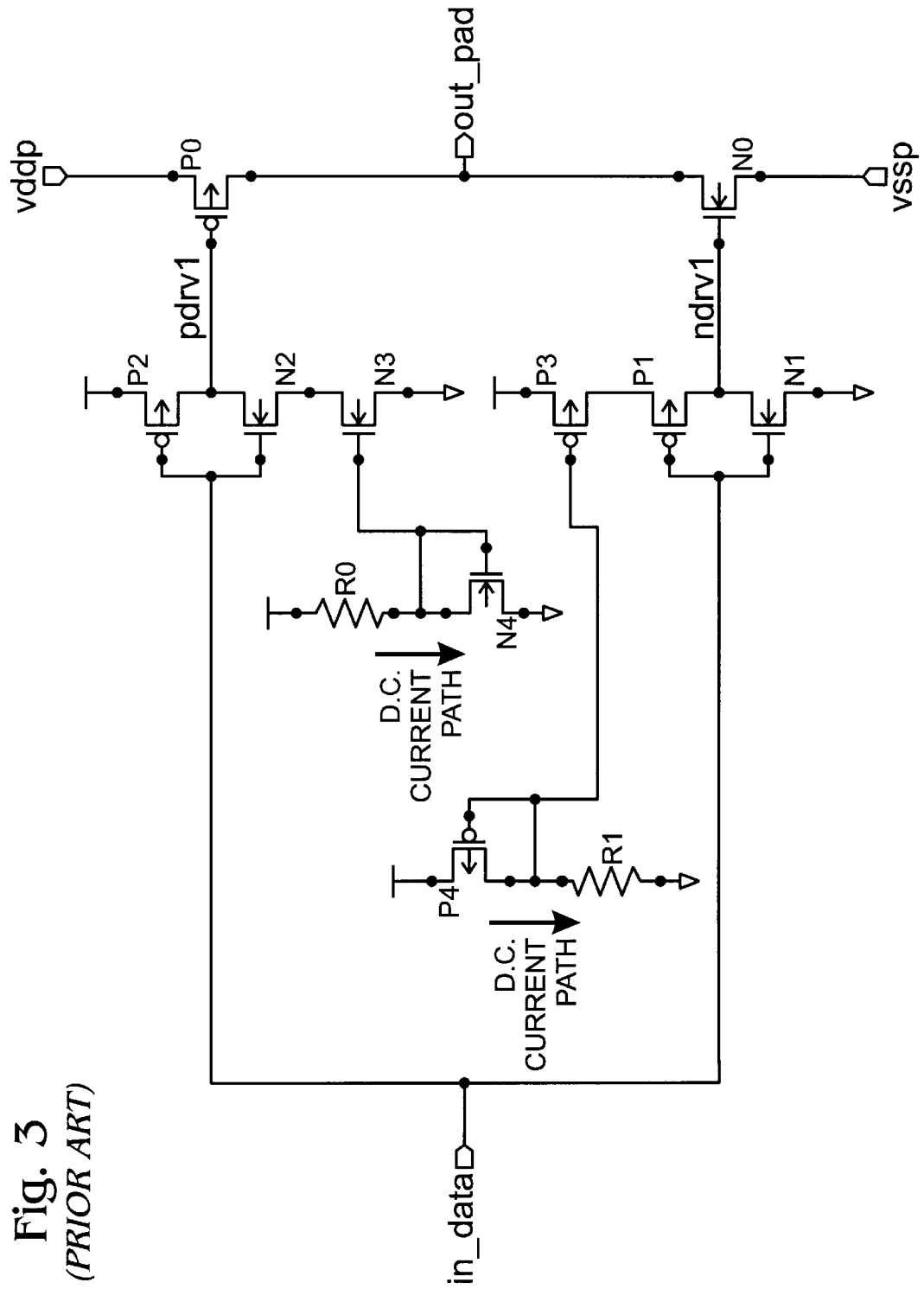
Figure 4:
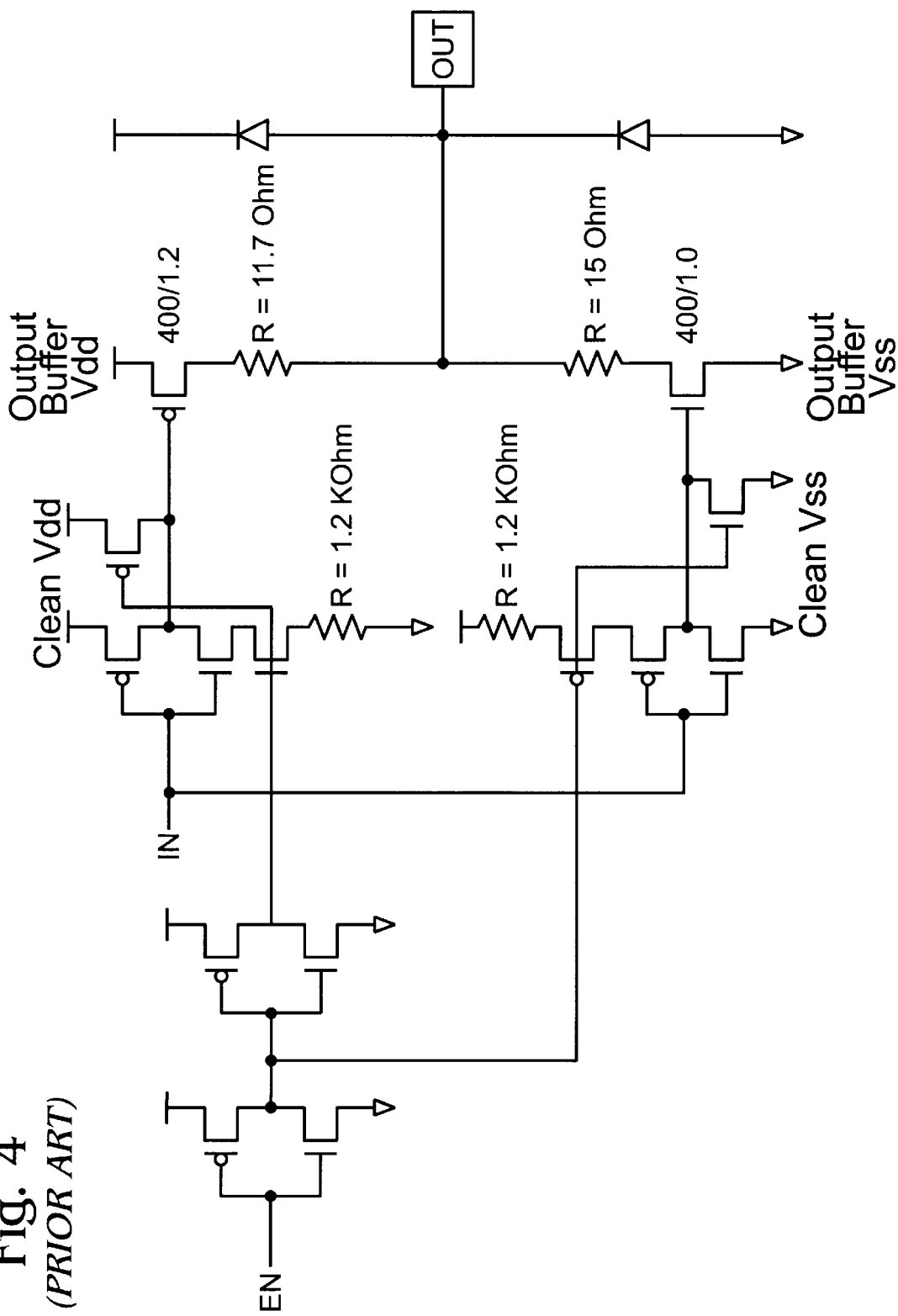
Figure 5:
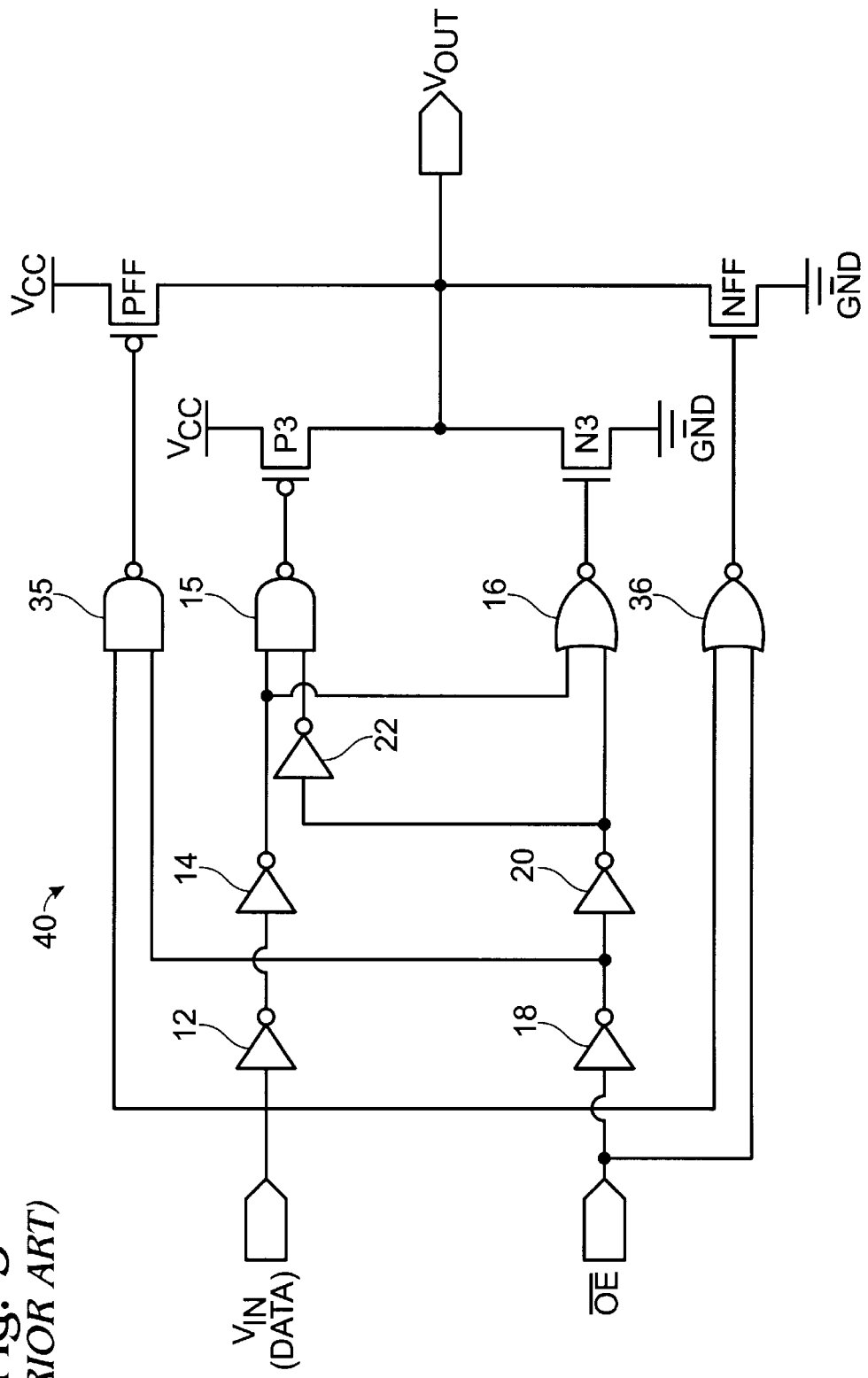
Figure 6:
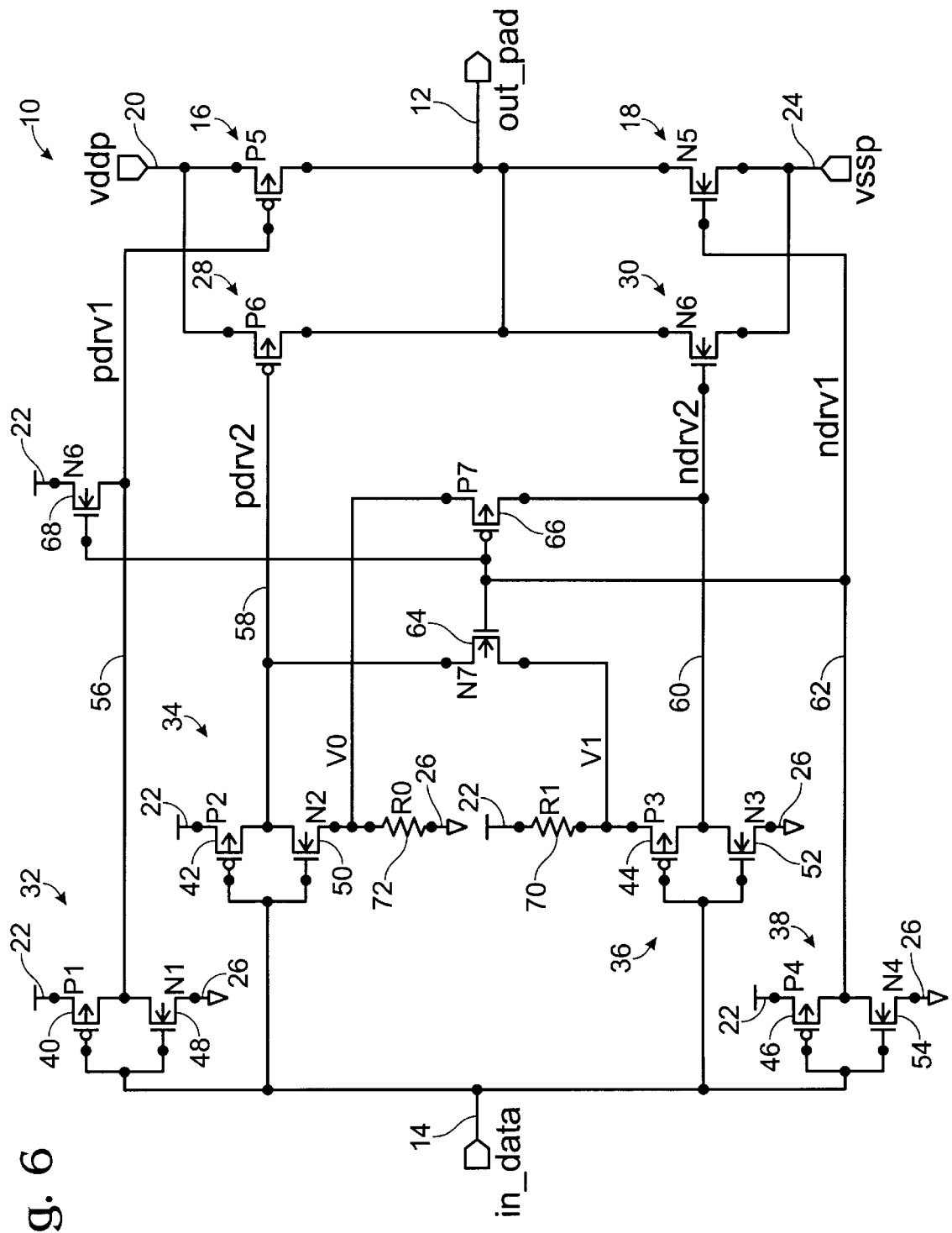
FIG. 6 is a schematic diagram of a low noise CMOS circuit of the present invention.

FIG. 6 is a schematic diagram of a low noise CMOS circuit of the present invention. CMOS circuit 10 provides a constant impedance load and linear-ramped current waveforms at a circuit output 12 in response to receiving an input signal at a circuit input 14. The circuit comprises a first pair of driver transistors, including a first PMOS pullup 16 and a first NMOS pulldown transistor 18. Circuit output 12 is operatively connected to the drain of first PMOS driver 16 and the drain of first NMOS driver 18.

A first (Vddp) 20 and second (Vdd) 22 power supply nodes are included. Low noise power supply node 22 is used to power the pre-driver circuits, discussed below. To minimize noise spikes on low noise supply 22, driver transistors 16 and 28 are coupled to a separate supply 20. Likewise, a first (Vssp) 24 and second (Vss) 26 ground nodes are included to separate the driver noise from the pre-driver circuitry.

Alternately said, the source of PMOS transistor P5 (16) is operatively connected to first power supply node (Vddp) 20, and the drain of P5 PMOS 16 is operatively connected to output 12 and the drain of NMOS transistor N5 18. The source of N5 NMOS 18 is operatively connected to first ground node (Vssp) 24.

A second pair of driver transistors, including a second PMOS pullup 28 and a second NMOS pulldown transistor 30 is also included. The sources and drains of PMOS pullup transistors 16 and 28 are operatively connected in parallel and the sources and drains of NMOS pulldown transistors 18 and 30 are operatively connected in parallel. That is, the source of PMOS transistor P6 (28) is operatively connected to first power supply node (Vddp) 20. The drain of P6 PMOS 28 is operatively connected to output 12 and the drain of NMOS transistor N6 30. The source of N6 NMOS 30 is operatively connected to the first ground node (Vssp) 24.

Four pre-driver circuits 32, 34, 36, and 38 of pullup and pulldown transistors are also included. The gates of each pre-driver circuit 32, 34, 36, and 38 are operatively connected to CMOS circuit input 14. Each pre-driver circuit 32, 34, 36, and 38 is operatively connected to the gate of a corresponding driver transistor 16, 28, 30, and 18, respectively.

That is, each pre-driver circuit 32, 34, 36, and 38 includes a transistor pair, with the drain of PMOS transistors P1, P2, P3 , and P4 (40, 42, 44, and 46) being operatively connected to second power supply node (Vdd) 22. The drain of each PMOS transistor 40, 42, 44, and 46 is operatively connected to a pre-driver output 56, 58, 60, and 62, respectively, and the drain of an NMOS transistor N1, N2, N3, and N4 (48, 50, 52, and 54), respectively. The source of each NMOS transistor 48, 50, 52, and 54 is operatively connected to second ground node (Vss) 24.

First pre-driver 32 includes said P1 and N1 transistors 40 and 48, with the gates of P1 and N1 transistors 40 and 48 operatively connected to circuit input 14 to accept the input signal. First pre-driver 32 output 56 is operatively connected to the gate of said driver PMOS P5 16 to supply the pdrv1 signal.

Second pre-driver 34 includes P2 and N2 transistors 42 and 50, with the gates of P2 and N2 transistors 42 and 50 operatively connected to circuit input 14 to accept the input signal. Second pre-driver output 58 is operatively connected to the gate of driver PMOS P6 28 to supply the pdrv2 signal.

Third pre-driver 36 includes P3 and N3 transistors 44 and 52, with the gates of P3 and N3 transistors 44 and 52 operatively connected to circuit input 14 to accept the input signal. Third pre-driver output 60 is operatively connected to the gate of driver NMOS N6 30 to supply the ndrv2 signal.

Fourth pre-driver 38 includes P4 and N4 transistors 46 and 54, with the gates of P4 and N4 transistors 46 and 54 operatively connected to circuit input 14 to accept the input signal. Fourth pre-driver output 62 is operatively connected to the gate of driver NMOS N5 to supply the ndrv1 signal.

A first source-follower NMOS pullup transistor 64 is included, with the source operatively connected to the gate of second PMOS driver 28. The gate of first source-follower pullup 64 is operatively connected to the gate of said first NMOS driver 18. That is, the drain of N7 NMOS 64 is operatively connected to second power supply node (Vdd) 22, the source operatively connected to the gate of P6 PMOS 28, and the gate operatively connected to the gate of N5 NMOS 18.

A first source-follower PMOS pulldown transistor 66 is included, with the drain operatively connected to the gate of second NMOS driver 30. The gate of first source-follower pulldown 66 is operatively connected to the gate of first NMOS driver 18. The source of P7 PMOS 66 is operatively connected to the gate of N6 NMOS 30, the drain operatively connected to second ground node (Vss) 26, and the gate operatively connected to the gate of N5 NMOS 18, whereby the circuit minimizes the generation of noise at the power nodes, ground nodes, and circuit output.

In some aspects of the invention, a second source-follower NMOS pullup transistor 68 is also included, with the source operatively connected to the gate of first PMOS driver 16. The gate of second source-follower pullup 68 is operatively connected to the gate of first NMOS driver 18. The drain of N8 NMOS 68 is operatively connected to second power supply node (Vdd) 22, the source operatively connected to the gate of P5 PMOS 16, and the gate operatively connected the gate of N5 NMOS 18.

A first resistor 70 is included having a first node operatively connected to the source of pre-driver P3 PMOS 44 and first N7 NMOS pullup transistor 64 drain. A second node is operatively connected to the second power supply node (Vdd) 22. A second resistor 72 is included having a first node operatively connected to the source of second pre-driver N2 NMOS 50 and first P7 PMOS pulldown transistor 66. A second node is operatively connected to second ground node (Vss) 26. In some aspects of the invention, first 70 and second 72 resistors have a resistance of approximately 306 ohms.

Figure 7:
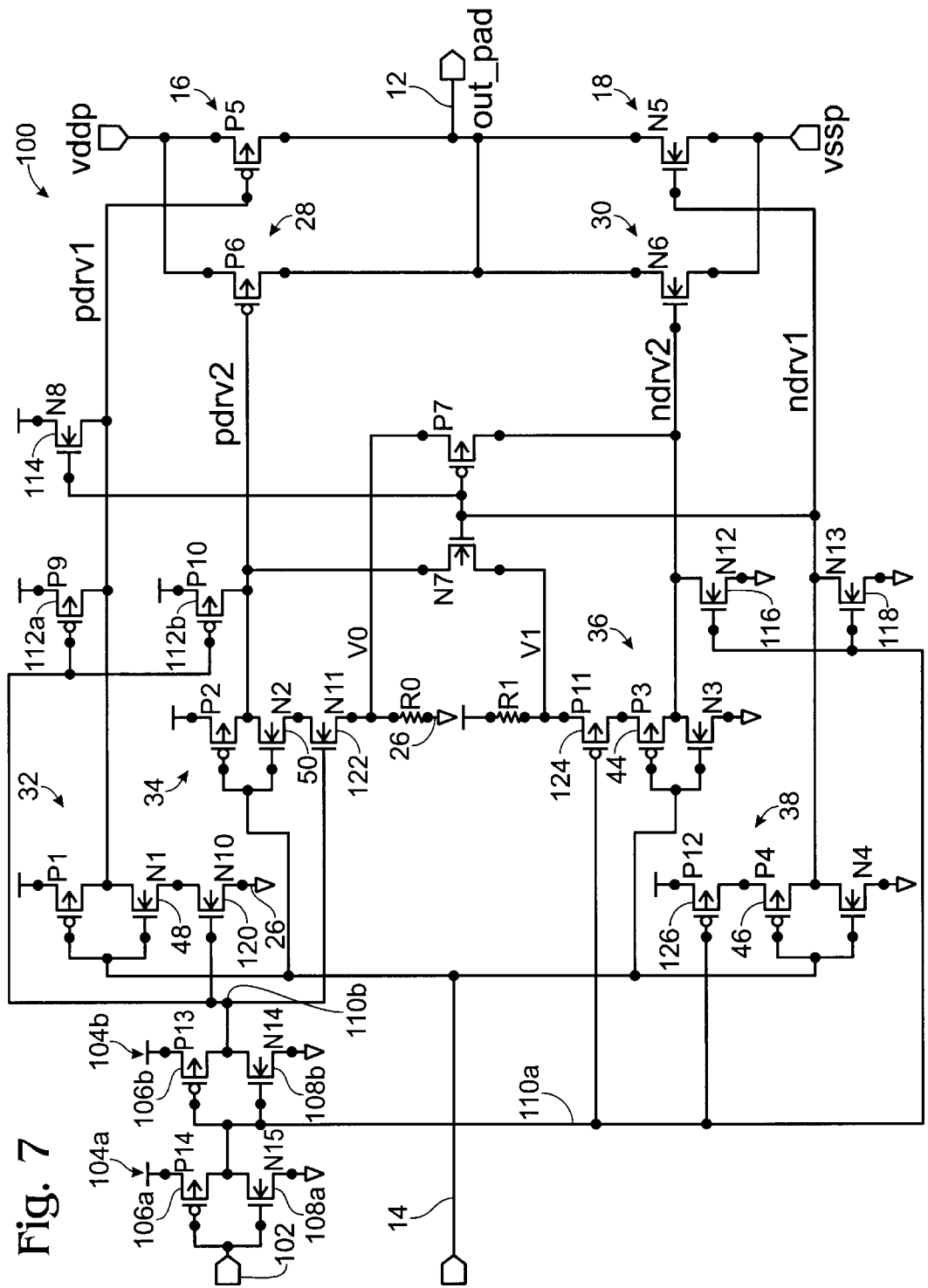
FIG. 7 is a schematic drawing of FIG. 6, with the addition of enable circuitry.

FIG. 7 is a schematic drawing of FIG. 6, with the addition of enable circuitry. CMOS enabling buffer 100 accepts an enable input signal at input 102, to selectively put the CMOS circuit output 12 into a high impedance state. CMOS enabling buffer 100 comprises an enable driver circuits 104a and 104b including pullup and pulldown transistors 106a, 106b, and 108a and 108b. The gates of enable driver circuits 104a and 104b are operatively connected to enable signal input 102. Enable driver circuit 104a has an output 110a, and enable driver circuit 104b has an output 110b.

A second PMOS 112a, third PMOS 112b, and third NMOS 114 PMOS pullup transistors are included, with the drain of second PMOS transistor 112a and the source of third NMOS transistor 114 operatively connected to the gate of first PMOS driver transistor 16, and the drain of third PMOS transistor 112b operatively connected to the gate of second PMOS driver transistor 28. The gates of second and third PMOS pullup transistors 112a and 112b are operatively connected to enable output 110b, and third NMOS pullup transistor 114 is operatively connected to enable circuit output 110a.

A fourth 116 and fifth 118 NMOS pulldown transistor is included, with the drains of fourth 116 and fifth 118 transistors operatively connected, respectively, to the gates of second 30 and first 18 NMOS driver transistors. The gates of fourth 116 and fifth 118 NMOS pulldown transistors are operatively connected to enable circuit output 110a.

First 32 and second 34 pre-driver circuits include enable transistors 120 and 122, respectively. The drain of enable transistors 120 and 122 are operatively connected to the source of pre-driver NMOS transistors 48 and 50 respectively. The source of enable transistors 120 and 122 are operatively connected to second ground node 26.

Third 36 and fourth 38 pre-driver circuits include enable transistors 124 and 126, respectively. The drains of enable transistors 124 and 126 are operatively connected to the sources of pre-driver PMOS transistors 44 and 46, respectively. The sources of enable transistors 124 and 126 are operatively connected to second power supply node 22.

Returning to FIG. 6, it is well known to use resistors 70 and 72 to help stabilize the rate of charge/discharge of the gates of output drivers 16, 18, 28, and 30, and a two-stage output driver to spread the duration of the transient switching event. However, the deployment of transistors N7 (64), P7 (66), and N8 (68) is novel and contributes several key benefits to the behavior of this buffer.

For illustrative purposes, the switching behavior in response to a falling transition on input 14 is described first. It will be apparent from the symmetry of the circuit that the complementary behavior in response to a rising transition of signals on input line (in_data) 14 is largely analogous to falling edge transitions.

Transistors N5 18 and P5 16 are relatively wide channel devices which each supply approximately one-third of the total output drive current (anywhere in the range of one-half to one-fifth will work). Transistors N6 30 and P6 28 are still wider channel devices which supply the remaining output drive current. P5 16 and P6 28 are each approximately twice the channel width of N5 18 and N6 30, respectively, to account for the lower PMOS mobility compared to NMOS while still providing comparable drive strengths. The pre-drivers 38 (ndrv1) and 32 (pdrv1) are sized to switch transistors N5 18 and P5 16 earlier and more rapidly than pre-drivers 36 (ndrv2) and 34 (pdrv2) which switch transistors N6 30 and P6 28, respectively. The output of the fastest pre-driver 38 (ndrv1) is used to control the slew rates of the other three pre-drivers 32, 34, and 36. This interaction helps stabilize the speed/noise performance of buffer 10.

Critical improvements in buffer 10 result from the placement of transistors N7 (64), N8 (68), and P7 (66). These are connected in source-follower configurations, in which they are intended to charge their source terminals toward a threshold voltage below their gate terminals, producing delayed (time and voltage shifted) voltage/current waveforms controlled by the voltage waveform on node ndrv1. They are connected in a feedback configuration to resistors R0 72 and R1 70, as shown in FIG. 6.

Figure 8:
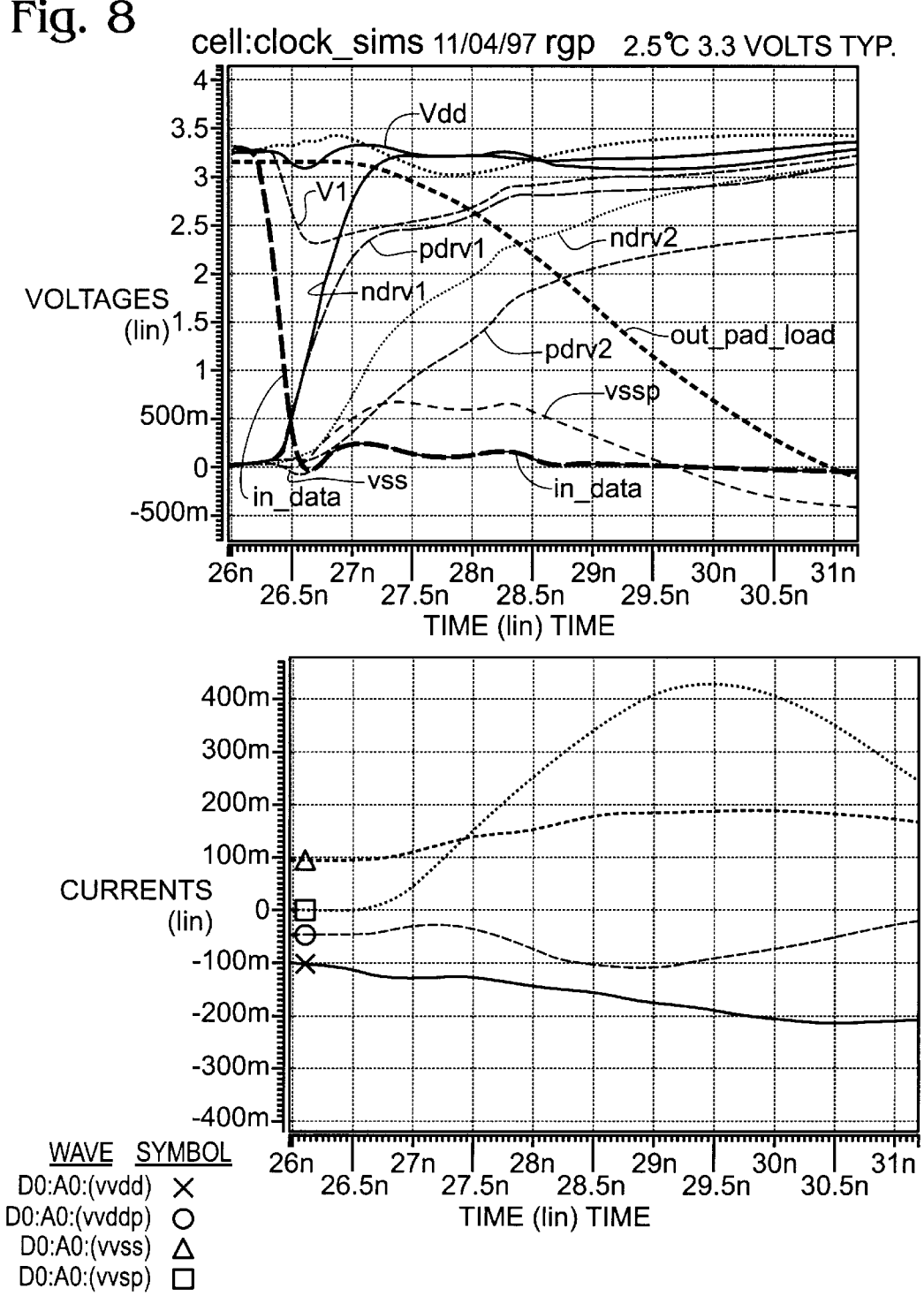
FIG. 8 shows the resulting voltage waveforms at the drain of N7.

Source-followers N7 (64) and N8 (68) provide the main discharge path to turn off the initially-on driver transistors P5 (16) and P6 (28) at a controlled rate. The channel current from N7 64 adds to the current from P3 44 through common resistor R1 70. FIG. 8 shows the resulting voltage waveforms at the drain of N7 64. The current component from N7 64, which begins slightly later than the rise of the output of pre-driver 38 (ndrv1), first pulls down the voltage at source of P3 44. This reduces the early drive on P3 44, slowing the initial rate of rise of the output of pre-driver 36 (ndrv2) and, hence, the turn-on of N6 30 until after N5 18 has fully turned on. Later, once the relatively fast rise of the output of pre-driver 38 (ndrv1) levels off, the current component from source follower N7 64 also begins to diminish as the output of pre-driver 34 (pdrv2) charges, thereby gradually providing a larger fraction of the current from R1 70 to charge up signal ndrv2 at a faster rate. Without this feedback, the voltage of signal ndrv2 would follow a decaying exponential (RC charging characteristic), resulting in a decaying ramp-up rate and slower than optimal output buffer as the current slope of N6 30 drops off rapidly with time. But with the feedback from the sum of current components through R1 70, the rising slope of signal ndrv1 initially suppresses the rise of signal ndrv2. Later, the rising slope of signal pdrv2 enhances the rate of rise of signal ndrv2. Together these actions shape the signal ndrv2 waveform in response to both signal ndrv1 and signal pdrv2 waveforms. This produces a composite buffer current transient with the required triangular slope and the desired flattened Vssp noise pulse. The ratio of the resistance of R1 70 to the channel dimensions of N7 64 is adjusted to tailor the voltage waveform on signal ndrv2, in order to obtain the most linear ramp of the total current through the output drivers (N5+N6) 18 and 30.

A second benefit of using source-followers N7 64 and N8 68 to turn off the initially-on driver transistors P5 16 and P6 28 is to stagger the initial current spike delivered into quiet Vdd 22 due to the charging of the large output driver gate capacitances. As the in_data pin 14 of every output buffer simultaneously falls, (when multiple buffers are used in an IC) the current flow into quiet Vdd from both P3 44 and P4 46 rapidly rises from zero. This must happen fast to start charging the gates of N5 18 and N6 30 quickly. Fortunately, the gate-to-channel capacitances of N5 18 and N6 30 are at their lowest at this time. This initial noise spike, induced by the rapidly changing currents from all output buffers into the lead inductance of the quiet power pin, constrains the allowable rate of activation of fast-responding output buffers. Charging the gate capacitances of a large number of driver transistors simultaneously can cause significant noise. This invention offers the advantage that the initial inrush current through the quiet-Vdd from P3 44 and P4 46 is not supplemented by even bigger inrush current from the gates of P5 16 or P6 28, because source followers N7 64 and N8 68 do not even begin conducting until signal ndrv1 exceeds their threshold. The peak of the initial activation noise spike ends by the time N7 64 and N8 68 gradually begin to conduct as signal ndrv1 rises. In contrast, many prior-art buffers begin their activation by immediately starting to discharge the large gate-to-channel capacitance of the fully-on driver transistors P5 16 and P6 28, which causes a much larger initial inrush current and noise disturbance on quiet power pins.

The function of transistors N3 52, P1 40, and P2 42 is to bleed off any charge remaining on the nodes of signals ndrv2, pdrv1, and pdrv2, respectively, and to hold them at full rail levels after being left a threshold short of the rail by the action of source follower transistors P7 66, N8 68, and N7 64. They assure that in the DC steady state, the channels of driver transistors N6 30, P5 16, and P6 28 become filly turned off to subthreshold leakage. These helper transistors can and should be made small enough to avoid their contributing significant switching noise themselves.

A third benefit to using source-followers such as N7 64 to turn off the initially-on driver transistor P6 28, instead of the prior-art's use of common-source configurations, is in the improved control this provides over the time-varying output impedance presented to out ad pin 12. To understand this benefit, one must recognize the differences between the current switching characteristics of heavily-loaded vs. lightly-loaded CMOS buffers. Prior CMOS art teaches the virtues of reducing the so-called crowbar current which flows between power supplies during the transient interval when both pullup and pulldown driver transistors are simultaneously on. As its input gate voltage transitions through the midpoint, the current through an un-loaded CMOS inverter reaches it maximum, which wastes power. However, in the case of a heavily loaded driver whose input transitions much faster than its output, the crowbar current is only a small fraction of the displacement current which must flow to charge or discharge the relatively large load capacitance. Thus, the loss in charge transfer efficiency is relatively small. It is more important to avoid hampering the performance of the buffer in an overzealous attempt to eliminate even minor crowbar current. This point is often ignored in prior-art buffers, which introduce extra time delay attempting to wait for the pullups (P5 & P6) 16 and 28 to turn mostly off before beginning to turn on the pulldowns (N5 & N6) 18 and 30. This delays the start of the desirable gradual output turn-on transition, significantly slowing the buffer. Some overlap of the switching transitions of pullup and pulldown drivers is beneficial for speeding up the buffer.

In fact, it turns out that even a significant overlap can be beneficial in other ways as well. First, consider the Thevenin equivalent of the output driver as seen from the outside of the chip. It can be viewed as a time varying voltage source in series with a time varying resistance. To maximize the signal energy transferred to a transmission-line load and minimize ringing due to reflections from that line, it is desirable to stably match the impedance of the output driver with that of its load. This goal includes minimizing variations in the output impedance of the buffer during the course of its switching event. This can be achieved by gradually increasing the channel impedance of the formerly-on transistor while simultaneously and proportionately decreasing the channel impedance of the formerly-off transistor. The source-followers N7 64 and N8 68 help achieve this. Their gate-source voltage offset compensates for the finite threshold voltage of the output driver transistor. With this offset, the drive current of P6 28 begins to drop just as that of N6 30 begins to rise, which is not until signal ndrv1 rises above the threshold of N6 30. Thus the turning-on driver N6 30 is reducing its channel resistance at about the same rate that the channel resistance of the turning-off driver P6 28 is rising.

Their net parallel combination presents a more nearly constant impedance to the load.

The other benefit of ramping the turning-off driver transistor's gate P6 28 at the same rate as the turning-on ramp of N6 30 is to control the reverse-polarity noise spike induced through the package inductance feeding P6 28, which results if currents are reduced too quickly. There are several situations where these turn-off transients must be considered. For example, data busses may be resistively terminated to a fixed voltage, so that the output current never drops to a low level. Some outputs may undergo multiple transitions in a short period of time (too short to allow the outputs to fully slew to their final level before reversing). In either case, the noise produced by too-rapidly decreasing the current through the switching-off transistor's supply inductance can exceed that of the switching-on side. Therefore both turn-on and turn-off current ramp rates should be similar, rather than trying to turn the drivers off much faster than they turn on.

Similarly in the case of the rising transition of signals on in_data pin 14, most of the operation is exactly complementary to the falling transition. In this case P7 66 acts as the source-follower to turn off signal ndrv2 and control the ramp rate of signal pdrv2 through R0 72. However, note that there is no source follower discharging signal ndrv1. It remains the controlling signal which gates the other source-followers. This is not a problem because signal ndrv1 is loaded primarily by N5 18, which has the smallest gate capacitance of all the predriver loads. The smaller capacitance more than makes up for its more abrupt turn-off rate in response to the rising edge of in_data. Its current and noise contributions can be adequately controlled by suitable selection of device sizes N4 54 and P4 46.

Returning to FIG. 7, a more detailed explanation of the enabling CMOS buffer 100 follows. Output enable control has been added which permits placing buffer 100 in a high-impedance (non-driving) state if desired. Pre-drivers 32 (pdrv1) and 34 (pdrv2) have been re-configured as NAND gates responsive both to in_data at input 14, and to a buffered version of the enable input on line 102. Pre-drivers 38 (ndrv1) and 36 (ndrv2) have been re-configured as NOR gates responsive both to in_data on line 14, and to an inverting-buffered version, on line 110a, of the enable signal on line 102. The buffering of the enable signal on line 102 in conjunction with P9 112, P10 114, N12 116, and N13 118 provide means to control the slew rate by which the buffer transitions to and from its high-impedance state. This slew rate is easy to adjust because only two of the four pre-drivers signals (ndrv1 and ndrv2, or pdrv1 and pdrv2) switch at any given time, which reduces the noise injected into the quiet power/ground pins. Simple device sizing provides sufficient slew rate control of the enable input.

Figure 9:
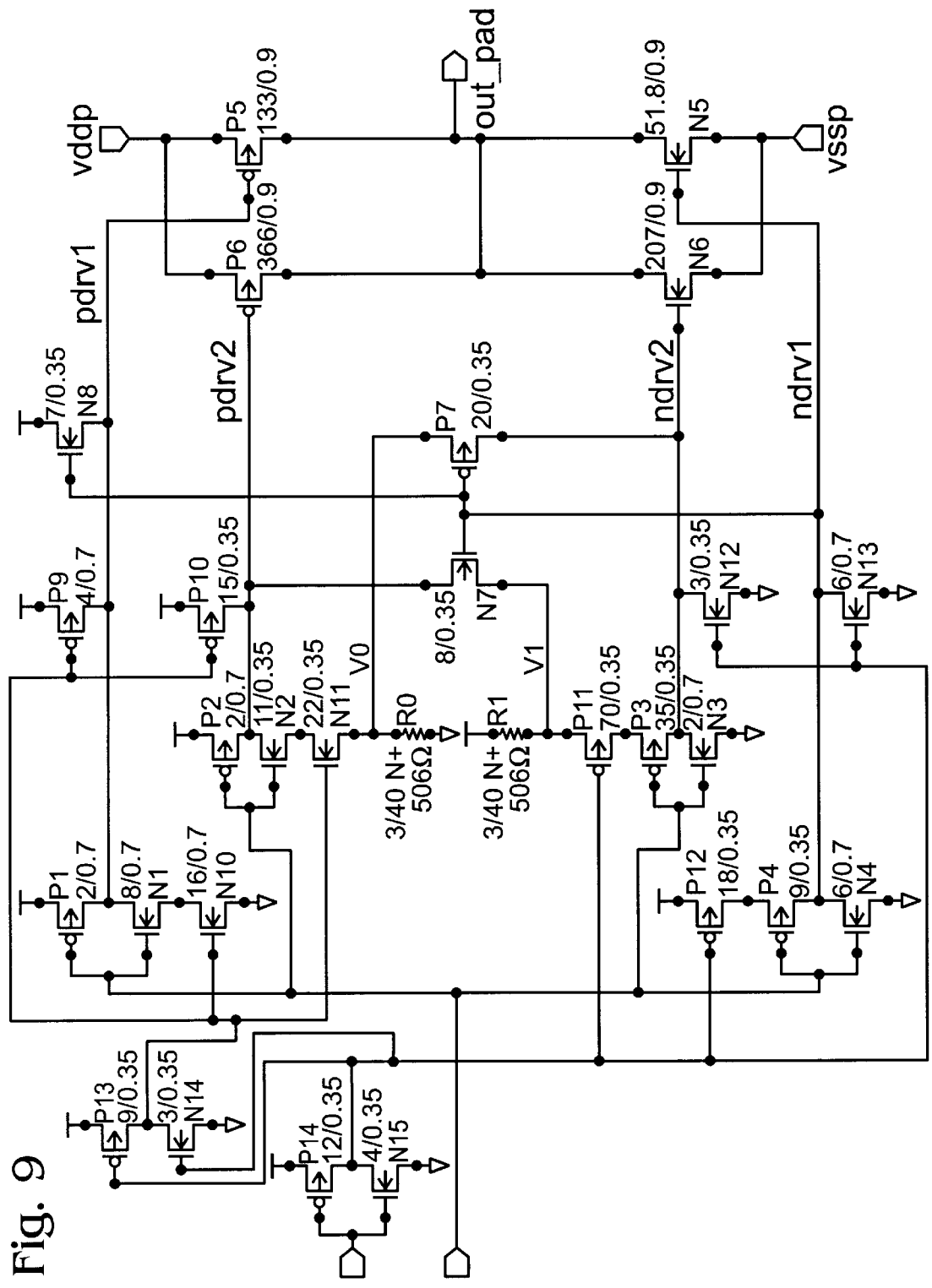
FIG. 9 shows the invention implemented in a 0.35 um digital CMOS process, with transistors sized appropriately for that technology.

FIG. 9 shows the invention implemented in a 0.35 um digital CMOS process, with transistors sized appropriately for that technology. The channel lengths of P1 P2 P5 P6 P9 N1 N3 N4 N5 N6 N10 and N13 have been increased to about twice the minimum allowed length to reduce the sensitivity of channel current to process dimensional variations. Using longer channel devices here does not slow the overall switching speed of the buffer, since the slew rates of each node must be throttled anyway to limit the switching noise components as described above. The reduced sensitivity to process variation allows the buffer to be designed closer to the noise performance limits under fast-PMOS:fast-NMOS process conditions, which in turn produces better speed performance under slow-PMOS:slow-NMOS process conditions.

Resistors R0 and R1 are preferably implemented as rectangular N+ type diffusion patterns which are much larger than the minimum feature size. This minimizes their sensitivity to process, dimensional, and temperature variations. The sizes may be adjusted to target different speed/noise performance tradeoff points. The resistances of R0 and R1 were determined by modeling and simulating this buffer in a 200-output DSP chip, wire-bonded into a 352 SBGA package. The 306 ohm resistor value attained the most comfortable margins for operation at 100 MHz: 3ns typical in-out propagation delay at 1 ns/volt output slew rates driving 35 pF loads, while inducing less than 0.4 volts of peak noise under worst-case operating conditions (fast-fast process, 3.6 volt supply, 0° C.).

Figure 10:
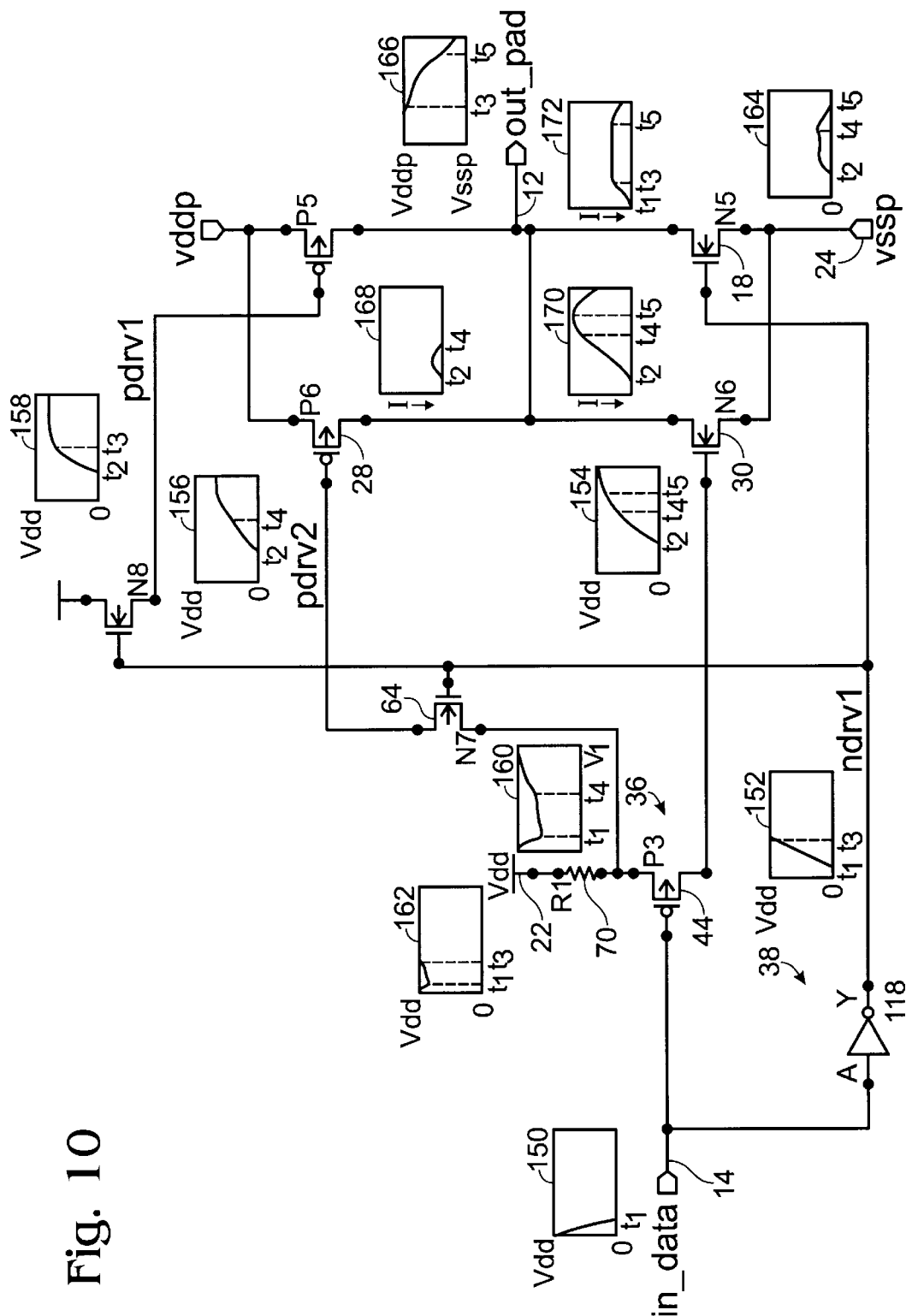
FIG. 10 is a simplified version of the buffer of FIG. 6 to show the signal waveforms at critical nodes.

FIG. 10 is a simplified version of the buffer of FIG. 6 to show the signal waveforms at critical nodes. Voltage reading 150 shows a negative going signal with a relatively fast fall-time at input 14. The voltage output 152 of fourth pre-driver 38 is generally a replica of the compliment of signal 150, with a first ramp duration, as compared to the fall time of the signal at input 14, and a first time delay, $t_1$. The voltage output 154 of third pre-driver 36 is dependent on input signal 150 and ndrv1 152, and is considered a replica of the compliment of input signal 150 with a second ramp duration, greater than the first ramp duration, and a second time delay $t_2$, greater than the first time delay $t_1$. The exact slopes of the first and second ramps and the times of $t_1$ and $t_2$ are dependent on a number of factors such as transistor resistance and capacitance parameters and voltage levels.

The output of the second pre-driver 34 (not shown) is primarily dependent on input signal 150, ndrv1 152, and ndrv2 154, for the polarity input signal shown. The effect of second pre-driver 34 does not strongly influence pdrv2 156 until a signal having a rising transition is input into node 14. Signal pdrv2 156 is a replica of the compliment of input signal 150 with a third ramp, greater than the second ramp, and a second time delay $t_2$. Likewise, first pre-driver 32 (not shown) is primarily dependent on input signal 150, ndrv1 152, ndrv2 154, and pdrv2 156, for the polarity of the input signal shown. The effect of first pre-driver 32 does not strongly influence pdrv1 158 until a signal having a rising transition is input into node 14. Signal pdrv1 158 is a replica of the compliment of input signal 150 with a second ramp, and a second time delay $t_2$.

Voltage signal 160 shows the critical effect of summing currents through resistor 70, as current is drawn by transistor 44, and then by transistor 64. Also shown is the voltage 162 at second power supply (Vdd) node 22, the voltage 164 at first ground (Vssp) 24, and the voltage 166 at output 12. Current signals 168, 170, and 172 show current flow at the drain of P6 28, the drain of N6 30, and the drain of N5 18, respectively.

As mentioned above, only the minimum number of components are used in FIG. 10 to simply illustrate the timing and signals of the present invention. An understanding of the complete circuit 10 of FIG. 6, with input signals having rise-times and fall-times, is more easily understood from an analysis of FIG. 10. An extrapolated understanding of the remaining transistors, not shown in FIG. 10, can then follow.

FIG. 11 is a flowchart illustrating the present invention method for providing an output having a constant impedance load with a linear ramped current waveform. FIG. 11 helps relate the interdependencies between signals that are central to the invention. Step 200 provides a low noise buffer circuit having two pair of parallel pullup and pulldown transistors. Step 202 accepts an input signal to be buffered. Step 204 performs the following sub-steps in response to the input signal. Step 204*a*, in response to the signal received in Step 202, provides a fourth pre-diver signal ndrv1 that is a replica of the compliment of the input signal, with a first ramp duration and a first time delay. Step 204*b*, in response to the signal received in Step 202 and the provision of the fourth pre-driver signal in Step 204*a*, provides a third pre-driver signal ndrv2 that is a replica of the compliment of the input signal, with a second ramp duration, greater than the first, and a second time delay, greater than the first. Step 204*c*, in response to the signal received in Step 202, the provision of the fourth pre-driver signal in Step 204*a*, and the provision of the third pre-driver signal in Step 204*b*, provides a second pre-driver signal pdrv2 that is replica of the compliment of the input signal, with a third ramp duration, greater than the second ramp duration, and a second time delay. Step 204*d*, in response to the signal received in Step 202, the provision of the fourth pre-driver signal in Step 204*a*, provides a first pre-driver signal pdrv1 that is replica of the compliment of the input signal, with a second ramp duration and a second time delay. Step 204*e*, in response to the fourth pre-driver signal ndrv1, gates a first pulldown driver transistor. Step 204*f*, in response to the third pre-driver signal ndrv2, gates a second pulldown driver transistor. Step 204*g*, in response to the second pre-driver signal pdrv2, gates a second pullup driver transistor. Step 204*h*, in response to the first pre-driver signal pdrv1, gates a first pullup driver transistor. Step 206 is a product, a low noise buffered signal.

In some aspects of the invention, a pullup and a pulldown transistor is provided in Step 200 and operatively connected to the output of a fourth pre-driver. Then, Step 204*a* includes influencing, with the ndrv1 signal, at least partially, the response of the pullup and pulldown transistors. Step 204*b* includes providing the ndrv2 signal at least partially in response to the action of the pullup and pulldown transistors. Step 204*c* includes providing the pdrv2 signal at least partially in response to the action of the pullup and pulldown transistors.

A low noise CMOS buffer has been provided which includes the advantages of having a constant load impedance and a linear-ramped current waveform at the output. The buffer adds source-follower pullup and pulldown transistors to delay the turn on the driver circuits, and to shape the voltage and current waveforms of the drivers. These critically placed pullup and pulldown transistors accomplish the same function when turning off the drivers. Other variations and embodiments will occur to those skilled in the art.

What is claimed is:

1. A low noise CMOS circuit to provide a constant impedance load and linear ramped current waveforms at the circuit output in response to receiving an input signal at a circuit input, the circuit comprising:

a first pair of driver transistors, including a first PMOS pullup and a first NMOS pulldown transistor, with the circuit output operatively connected to the drain of said first PMOS driver and the drain of said first NMOS driver;

a second pair of driver transistors, including a second PMOS pullup and a second NMOS pulldown transistor, with the sources and drains of said PMOS pullup transistors operatively connected in parallel and the sources and drains of said NMOS pulldown transistors operatively connected in parallel;

four pre-driver circuits of pullup and pulldown transistors, with the gates of each pre-driver circuit operatively connected to the CMOS circuit input, and with each said pre-driver circuit operatively connected to the gate of a corresponding driver transistor;

a first source-follower NMOS pullup transistor, with the source operatively connected to the gate of said second PMOS driver, and the gate of said first source-follower pullup operatively connected to the gate of said first NMOS driver;

a first source-follower PMOS pulldown transistor, with the source operatively connected to the gate of said second NMOS driver, and the gate of said first source-follower pulldown operatively connected to the gate of said first NMOS driver.

2. A CMOS circuit as in claim 1 further comprising:

a second source-follower NMOS pullup transistor, with the source operatively connected to the gate of said first PMOS driver, and the gate of said second source-follower pullup operatively connected to the gate of said first NMOS driver.

3. A CMOS circuit as in claim 2 wherein the circuit is operatively connected to first (Vddp) and second (Vdd) power supply nodes, and first (Vssp) and second (Vss) ground nodes, and in which said first and second PMOS driver sources are operatively connected to said first power supply node and said first and second NMOS driver sources are operatively connected to said first ground node, in which said PMOS pre-driver sources are operatively connected to the second power supply node and said NMOS pre-driver sources are operatively connected to said second ground node, and in which said first and second pullup transistor drains are operatively connected to said second power supply node and said first pulldown transistor drain is operatively connected to said second ground node.

4. A CMOS circuit as in claim 3 in which the output of said first pre-driver circuit is operatively connected to said first PMOS driver gate, in which the output of said second pre-driver circuit is operatively connected to the said second PMOS driver gate, in which the output of said third pre-driver circuit is operatively connected to said second NMOS driver gate, in which the output of said fourth pre-driver circuit is operatively connected to the said first NMOS driver gate.

5. A CMOS circuit as in claim 4 further comprising:

a first resistor having a first node operatively connected to said third pre-driver PMOS source and said first NMOS pullup transistor drain, and a second node operatively connected to the second power supply node; and a second resistor having a first node operatively connected to said second pre-driver NMOS source and said first PMOS pulldown transistor drain, and a second node operatively connected to the second ground node.

6. A CMOS circuit as in claim 5 in which said first and second resistors have a resistance of approximately 306 ohms.

7. A CMOS circuit as in claim 1 wherein the input signal has a frequency of approximately 100 MHz, in which said PMOS and NMOS transistors are sized for a 0.35 micron process, and in which the CMOS circuit output is operatively connected to a load having a capacitance as large as 35 picofarads (pF).

8. A CMOS circuit as in claim 5 wherein enable circuitry is added, operatively connected to an enable input signal, to selectively put the CMOS circuit output into a high impedance state, and further comprising:

enable driver circuits including pullup and pulldown transistors, with the gates of said enable driver circuit operatively connected to the enable signal input, said enable driver circuit having an outputs;

a second PMOS, third PMOS, and third NMOS pullup transistor, with the drains of said second PMOS transistor and the source of said third NMOS transistors operatively connected to said first PMOS driver transistor gate, and said third PMOS pullup transistor drain operatively connected to said second PMOS driver transistor gate, and the gates of said second and third PMOS, and said third NMOS pullup transistors operatively connected to said enable circuit outputs;

a fourth and fifth NMOS pulldown transistor, with the sources of said fourth and fifth transistors operatively connected, respectively, to said second and first NMOS driver transistor gates, and the gates of said third and fourth NMOS pulldown transistors operatively connected to said enable circuit output;

in which said first and second pre-driver circuits include an enable transistor, with the drain of said enable transistors operatively connected to said pre-driver NMOS source, and the source of said enable transistors operatively connected to said second ground node; and in which said third and fourth pre-driver circuits include an enable transistor, with the drains of said enable transistors operatively connected to said pre-driver PMOS drain, and the sources of said enable transistors operatively connected to said second power supply node.

9. A low noise CMOS circuit to provide a constant impedance load and linear ramped current waveform at the circuit output in response to receiving an input signal at a circuit input, the circuit comprising:

first (Vddp) and second (Vdd) power supply nodes, and first (Vssp) and second (Vss) ground nodes;

a first pair of driver transistors, with the source of PMOS transistor P5 operatively connected to said first power supply node (Vddp), the drain of said P5 PMOS operatively connected to the output and the drain of NMOS transistor N5, and the source of said N5 NMOS operatively connected to said first ground node (Vssp);

a second pair of driver transistors operatively connected in parallel to said first transistor pair, with the source of PMOS transistor P6 operatively connected to said first power supply node (Vddp), the drain of said P6 PMOS operatively connected to the output and the drain of NMOS transistor N6, and the source of said N6 NMOS operatively connected to the said ground node (Vssp);

four pre-driver circuits, which each pre-driver circuit including a transistor pair, with the source of a PMOS transistor (P1, P2, P3, and P4) operatively connected to said second power supply node (Vdd), the drain of said PMOS transistors operatively connected to a pre-driver output and the drain of an NMOS transistor (N1, N2, N3, and N4), and the source of said NMOS transistors operatively connected to said first ground node (Vssp);

in which a first pre-driver includes said P1 and N1 transistors, with the gates of said P1 and N1 transistors operatively connected to the circuit input to accept the input signal, said first pre-driver output operatively connected to the gate of said driver PMOS P5 to supply the pdrv1 signal;

in which a second pre-driver includes said P2 and N2 transistors, with the gates of said P2 and N2 transistors operatively connected to the circuit input to accept the input signal, said second pre-driver output operatively connected to the gate of said driver PMOS P6 to supply the pdrv2 signal;

in which a third pre-driver includes said P3 and N3 transistors, with the gates of said P3 and N3 transistors operatively connected to the circuit input to accept the input signal, said third pre-driver output operatively connected to the gate of said driver NMOS N6 to supply the ndrv2 signal;

in which a fourth pre-driver includes said P4 and N4 transistors, with the gates of said P4 and N4 transistors operatively connected to the circuit input to accept the input signal, said fourth pre-driver output operatively connected to the gate of said driver NMOS N5 to supply the ndrv1 signal;

a first NMOS (N7) pullup transistor, with the drain of said N7 NMOS operatively connected to said second power supply node (Vdd), the source operatively connected to said P6 PMOS gate, and the gate operatively connected said N5 NMOS gate;

a second NMOS (N8) pullup transistor, with the drain of said N8 NMOS operatively connected to said second power supply node (Vdd), the source operatively connected to said P5 PMOS gate, and the gate operatively connected said N5 NMOS gate; and a first PMOS (P7) pulldown transistor, with the source of said P7 PMOS operatively connected to said N6 NMOS gate, the drain operatively connected to said second ground node (Vss), and the gate operatively connected said N5 NMOS gate, whereby the circuit minimizes the generation of noise at the power nodes, ground nodes, and circuit output.

10. A CMOS circuit as in claim 9 further comprising:

a first resistor having a first node operatively connected to said third pre-driver P3 PMOS source and said first N7 NMOS pullup transistor drain, and a second node operatively connected to said second power supply node (Vdd); and a second resistor having a first node operatively connected to said second pre-driver N2 NMOS source and said first P7 PMOS pulldown transistor drain, and a second node operatively connected to said second ground node (Vss).

11. In a low noise buffer circuit having two pair of parallel pullup pulldown transistors, a method for providing an output having a constant impedance load with a linear ramped current waveform, the method comprising the steps of:

a) accepting an input signal to be buffered; and b) performing the following sub-steps in response to the input signal:

1) in response to the signal received in Step a), providing a fourth pre-diver signal ndrv1 that is a replica of the compliment of the input signal, with a first ramp duration and a first time delay;

2) in response to the signal received in Step a) and the provision of the fourth pre-driver signal in Step a)1), providing a third pre-driver signal ndrv2 that is a replica of the compliment of the input signal, with a second ramp duration, greater than the first, and a second time delay, greater than the first;

3) in response to the signal received in Step a), the provision of the fourth pre-driver signal in Step a)1), and the provision of the third pre-driver signal in Step a)2), providing a second pre-driver signal pdrv2 that is replica of the compliment of the input signal, with a third ramp duration, greater than the second ramp duration, and a second time delay;

4) in response to the signal received in Step a), the provision of the fourth pre-driver signal in Step a)1), providing a first pre-driver signal pdrv1 that is replica of the compliment of the input signal, with a second ramp duration and a second time delay;

5) in response to the fourth pre-driver signal ndrv1, gating a first pulldown driver transistor;
6) in response to the third pre-driver signal ndrv2, gating a second putdown driver transistor;
7) in response to the second pre-driver signal pdrv2, gating a second pullup driver transistor; and
8) in response to the first pre-driver signal pdrv1, gating a first pullup driver transistor, whereby a low noise buffer signal is provided.

12. A method as in claim 11 wherein a pullup and a pulldown transistor is provided operatively connected to the output of a fourth pre-driver, in which Step b)1) includes influencing, at least partially, the response of the pullup and pulldown transistors, in which Step b)2) includes providing the ndrv2 signal, at least partially in response to the action of the pullup and pulldown transistors, and in which Step b)3) includes providing the pdrv2 signal, at least partially in response to the action of the pullup and pulldown transistors.

* * * * *

UNITED STATES PATENT AND TRADEMARK OFFICE
CERTIFICATE OF CORRECTION

PATENT NO. : 6,051,995
DATED : April 18, 2000
INVENTOR(S) : Robert Pollachek

It is certified that error appears in the above-identified patent and that said Letters Patent is hereby corrected as shown below:

In the drawings, Sheet 6, Fig. 6, the element identified by reference number 68, source-follower N6, should be N8.

In the drawings, Sheet 8, Fig. 6, the following table:

| WAVE | SYMBOL |
|---|---|
| D0:A0:(vvdd) | X |
| D0:A0:(vvddp) | O |
| D0:A0:(vvss) | Δ |
| D0:A0:(vvsp) | ⊓ | should be:

| WAVE | SYMBOL |
|---|---|
| D0:A0:i(vvdd) | X |
| D0:A0:i(vvddp) | O |
| D0:A0:i(vvss) | Δ |
| D0:A0:i(vvsp) | ⊓ |

In the drawings, Sheet 9, Fig.9, resistors R0 and R1, each identified as having a value of 506Ω, should be 306Ω.

UNITED STATES PATENT AND TRADEMARK OFFICE
CERTIFICATE OF CORRECTION

PATENT NO. : 6,051,995
DATED : April 18, 2000
INVENTOR(S) : Robert Pollachek

It is certified that error appears in the above-identified patent and that said Letters Patent is hereby corrected as shown below:

Column 1,
Line 8, CNIOS should be CMOS.
Line 63, the term in the formula: $=2*N*C\Delta V/xt=$ should be $=2*N*C\Delta V/\Delta t=$ Signed and Sealed this Nineteenth Day of June, 2001

*Attest:*

*Attesting Officer*

NICHOLAS P. GODICI
*Acting Director of the United States Patent and Trademark Office*